United States Patent
Bass

(10) Patent No.: US 6,303,489 B1
(45) Date of Patent: *Oct. 16, 2001

(54) SPACER-DEFINED DUAL DAMASCENE PROCESS METHOD

(75) Inventor: William Scott Bass, Cedar Creek, TX (US)

(73) Assignee: Advanced Micro Devices, Inc., Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/090,268

(22) Filed: Jun. 3, 1998

(51) Int. Cl.$^7$ .............................................. H01L 21/4763
(52) U.S. Cl. .......................... 438/624; 438/638; 438/639
(58) Field of Search ................................... 438/637, 638, 438/639, 624, 622

(56) References Cited

U.S. PATENT DOCUMENTS

| | | | |
|---|---|---|---|
| 4,832,789 | * 5/1989 | Cochran et al. | 156/644 |
| 5,614,765 | 3/1997 | Avanzino et al. | 257/774 |
| 5,635,423 | 6/1997 | Huang et al. | 437/195 |
| 5,686,354 | 11/1997 | Avanzino et al. | 437/190 |
| 5,686,357 | * 11/1997 | Howard | 438/639 |
| 5,705,430 | 1/1998 | Avanzino et al. | 437/195 |
| 5,795,823 | 8/1998 | Avanzino et al. | 438/639 |
| 5,904,565 | * 5/1999 | Nguyen et al. | 438/687 |
| 5,916,823 | * 6/1999 | Lou et al. | 438/738 |
| 5,940,731 | * 8/1999 | Wu | 438/640 |
| 5,960,318 | * 9/1999 | Peschke et al. | 438/637 |
| 5,981,376 | * 11/1999 | Komatsu et al. | 438/629 |
| 5,985,762 | * 11/1999 | Geffken et al. | 438/687 |

\* cited by examiner

Primary Examiner—Wael Fabmry
Assistant Examiner—Kurt Eaton
(74) Attorney, Agent, or Firm—Williams, Morgan & Amerson

(57) ABSTRACT

A method of fabricating integrated circuits utilizing dual damascene processing when a soft insulative material, such as a polymer, is used. Vertical and horizontal edges of via and conductive line openings are protected from degradation during a second etching step by, prior to the second etching, depositing a hard mask material on each insulative material layer to protect the horizontal edges and depositing a spacer material to protect the vertical edges.

20 Claims, 6 Drawing Sheets

SPACER - DEFINED DUAL DAMASCENE PROCESS METHOD

BACKGROUND OF THE INVENTION

1. Field of the Invention

This invention relates to integrated circuit fabrication, and in particular, dual damascene processing of conductive lines and vias.

2. Background

An integrated circuit is formed by successive fabrication steps of depositing insulative material, forming grooves in the insulative material according to a specific pattern, and filling those grooves with conductive material. The filled material forms conductive lines and vias. Successive layers of conductive material form the integrated circuit elements and their interconnections. This fabrication process is known as damascene processing.

Dual damascene is a process whereby multilevel grooves are formed creating both conductive line openings and via openings to be filled in one process step with conductive material. An insulative material is coated with a resist layer, also known as a photomask, which is exposed to a mask with an image pattern of via openings. The upper half of the insulative material is etched. The photomask is then removed. The insulative material is again coated with a resist layer, which is exposed to a second mask with an image pattern of conductive lines. The insulative material is etched again. Grooves for the conductive lines are formed in the upper half of the insulative material and the already existing via openings are simultaneously etched in the lower half of the insulative material. The grooves are then filled with a conductive material, forming vias and conductive lines.

Dual damascene processing allows simultaneous filling of conductive lines and vias eliminating process steps. However, when using dual damascene processing with soft materials as the insulative material, such as a polymer material, the edges of the via openings are poorly defined due to the dual etchings.

SUMMARY OF THE INVENTION

A method of integrated circuit fabrication using soft materials for the insulative layer, such as a polymer material, utilizing dual damascene processing is disclosed. A spacer layer is utilized to improve the vertical edges of conductive lines and vias in an insulative material. Hard mask layers deposited on insulative material layers are utilized to improve the definition of horizontal edges of conductive lines and vias in the insulative material.

A further understanding of the nature and advantages of the present invention may be realized by reference to the remaining portions of the specification and the drawings.

BRIEF DESCRIPTION OF THE DRAWINGS

So that the manner in which the above recited advantages and features of the present invention, as well as others which will become apparent, are attained and can be understood in detail, a more particular description of the invention summarized above may be had by reference to the embodiment thereof which is illustrated in the appended drawings, which drawings form a part of this specification. It is to be noted, however, that the appended drawings illustrate only typical embodiments of the invention and are therefore not to be considered limiting of its scope, for the invention may admit to other equally effective embodiments.

DETAILED DESCRIPTION OF PREFERRED EMBODIMENTS

Figure 1A:
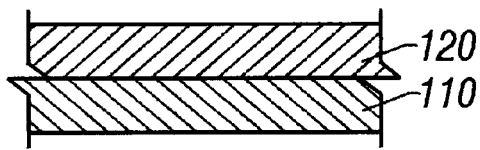
FIGS. 1(a) through (e), prior art, are typical process steps for a damascene process.
Figure 1B:
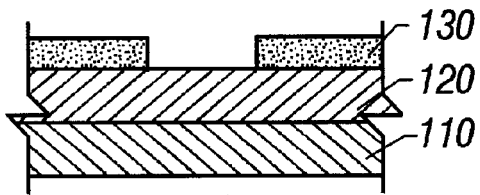
Figure 1C:
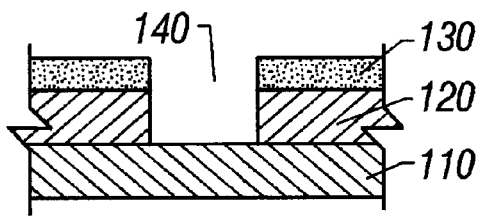
Figure 1D:
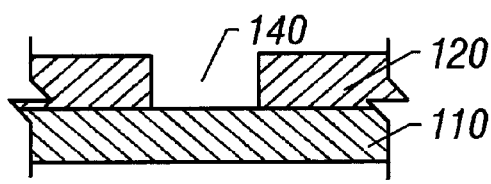
Figure 1E:
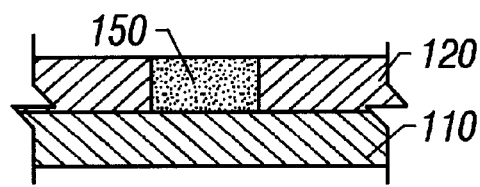

FIGS. 1(a) through (e), prior art, are typical process steps for a damascene process. FIG. 1(a) shows the deposition of an insulative material 120 on substrate 110. Typical insulative materials include silicon dioxide, silicon nitride and fluorinated oxides. FIG. 1(b) shows the creation of a photomask 130 with an opening for a conductive line. A photoresist layer added onto the insulative material and exposed to an image pattern of a conductive line opening creates the photomask. Using an etching process, the insulative material 120 is etched as shown in FIG. 1(c), creating a conductive line opening 140. Any etching technique may be used, such as plasma etching processes including RIE (Reactive Ion Etch) and MERIE (Magnetically Enhanced Reactive Ion Etch). The photomask 130 is removed as shown in FIG. 1(d). A conductive material 150 is deposited in conductive line opening 140 as shown in FIG. 1(e). Typical conductive materials used are copper and aluminum.

Figure 2A:
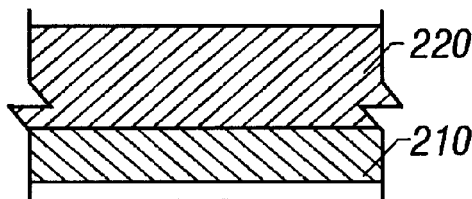
FIGS. 2(a) through (h), prior art, are typical process steps for a dual damascene process.
Figure 2B:
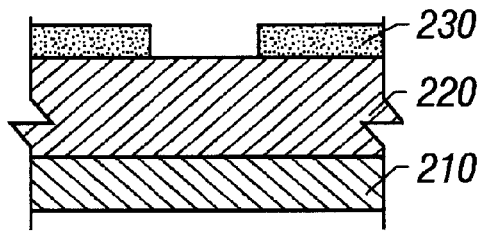
Figure 2C:
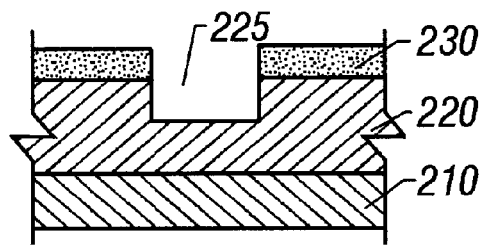
Figure 2D:
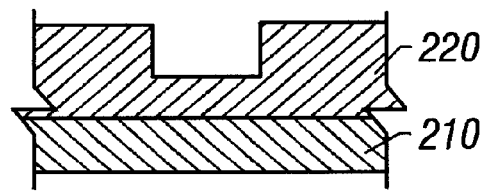
Figure 2E:
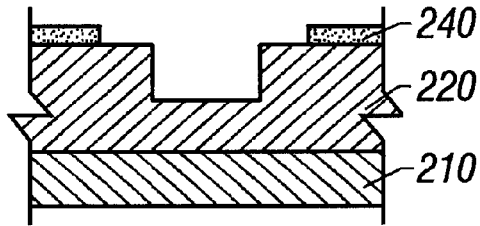
Figure 2F:
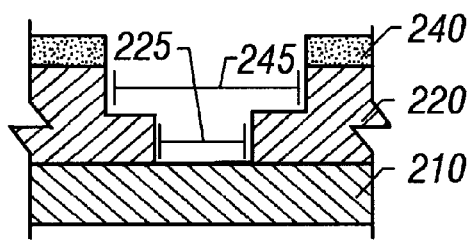
Figure 2G:
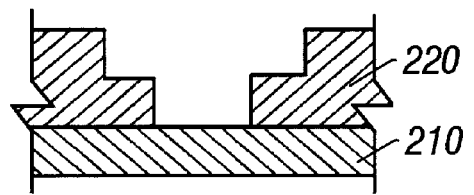
Figure 2H:
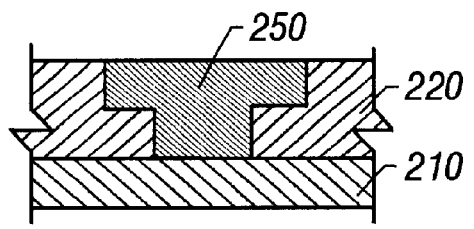

FIGS. 2(a) through (h), prior art, are typical process steps for a dual damascene process. FIG. 2(a) shows the deposition of an insulative material 220 on substrate 210. Typical insulative materials include silicon dioxide, silicon nitride and fluorinated oxides. FIG. 2(b) shows the creation of a photomask 230 with an opening for a via. Using any available etching process, the insulative material 220 is etched partially, approximately half way through insulative material 220, as shown in FIG. 2(c), creating a via opening 225. The photomask 230 is removed as shown in FIG. 2(d). FIG. 2(e) shows the creation of a second photomask 240 with an opening for a conductive line. Using any available etching process, the insulative material 220 is etched partially, creating a conductive line opening 245 and deepening the via opening 225 to the substrate 210 as shown in FIG. 2(f). The second photomask 240 is removed as shown in FIG. 2(g). A conductive material 250 is deposited in via opening 225 and conductive line opening 245 as shown in FIG. 2(h). Typical conductive materials used are copper and aluminum.

The insulative materials typically used in dual damascene processes are rigid and have high dielectric constants. The strength of the material, also referred to as etch resistance, enables the edges of the via openings to withstand degradation due to the dual etching steps. However, materials with high dielectric constants have higher capacitance, requiring the circuits to run slower. The industry is moving towards the use of materials with low dielectric constants as the insulative materials. Typically the insulative materials used are spin-on polymers such as BCB (benzocyclobutilene), FLARE and SiLK (hydrocarbon polymers). Other polymers or soft insulative materials may be used. Polymers have low dielectric constants, which lowers the capacitance of the circuits enabling the circuits to run faster. However, polymers are softer, i.e., have lower etch resistance, and have higher elasticity than the oxides typically used in a dual damascene process.

Figure 3:
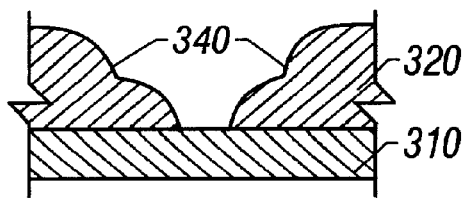
FIG. 3 shows typical problems resulting from a dual damascene process utilizing a polymer material as the insulative material.

FIG. 3 shows typical problems resulting from a dual damascene process where a soft material, such as a polymer material, is used as the insulative material. Insulative material 320 is deposited on substrate 310. After similar processing as shown in FIGS. 2(a)–(g), a via and conductive line opening is formed. As shown in FIG. 3, both the vertical and horizontal edges 340 of the via and conductive line opening are degraded from the dual etching steps. The edges slope inward and the corners are not well defined.

Figure 4A:
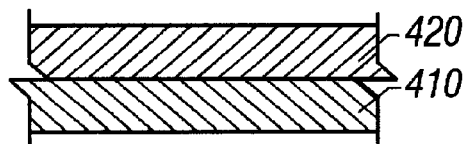
FIGS. 4(a) through (n) are the preferred process steps for the present invention.
Figure 4B:
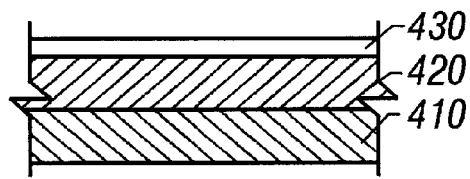
Figure 4C:
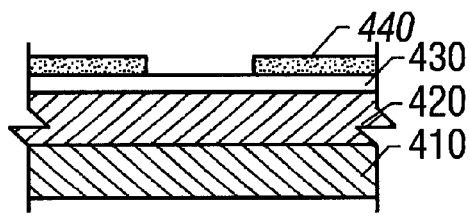
Figure 4D:
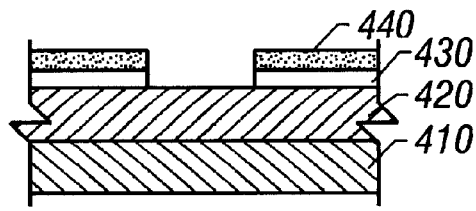
Figure 4E:
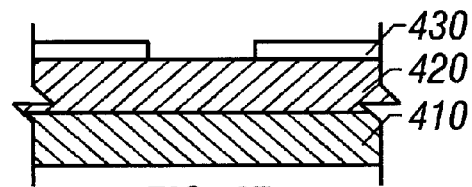
Figure 4F:
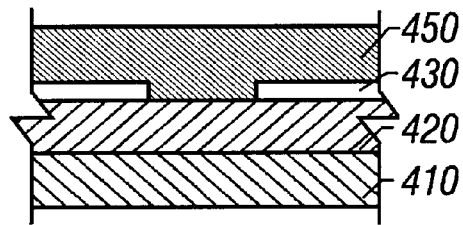
Figure 4G:
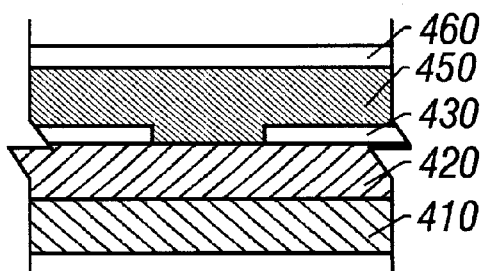
Figure 4H:
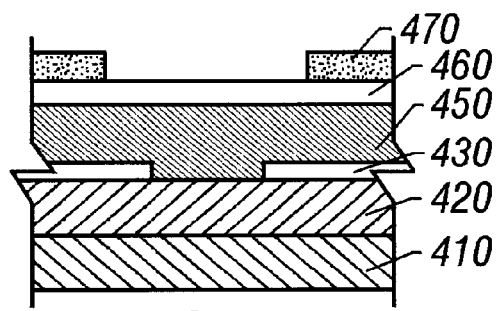
Figure 4I:
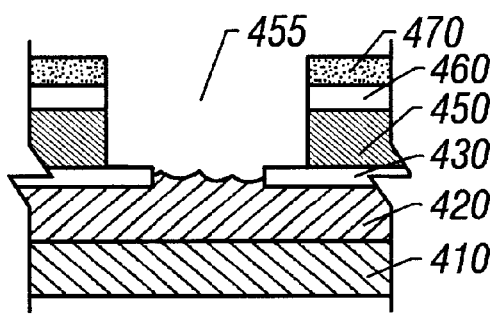
Figure 4J:
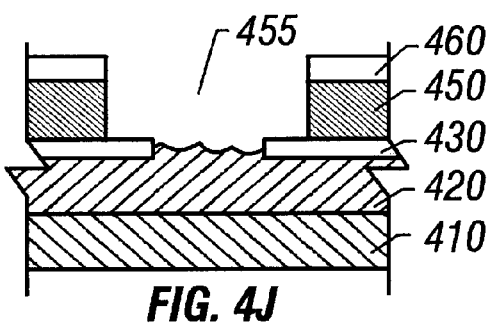
Figure 4K:
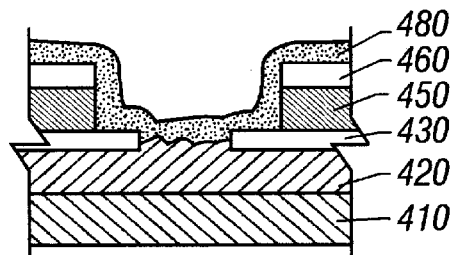
Figure 4L:
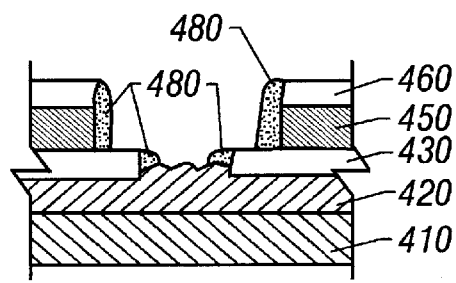
Figure 4M:
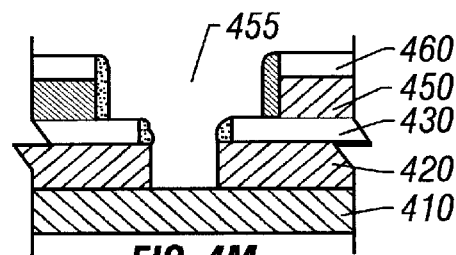
Figure 4N:
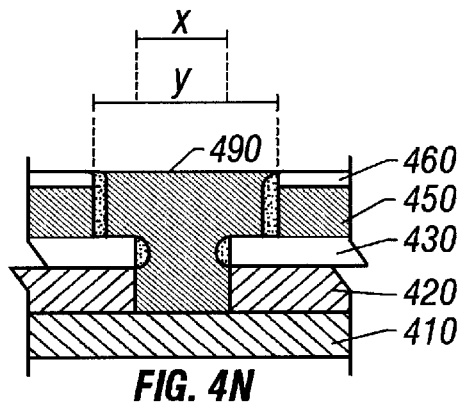

FIG. 4(a) through (n) are the preferred process steps for the present invention. FIG. 4(a) shows the deposition of a first insulative material 420 on substrate 410. The insulative materials are typically spin-on polymers such as BCB (benzocyclobutilene), FLARE and SiLK (hydrocarbon polymers). Other polymers or soft insulative materials may be used. Approximately 7000 angstroms of insulative material 420 is deposited. FIG. 4(b) shows the deposition of a first thin hard mask 430. Typical materials used for the hard mask include silicon dioxide and silicon nitride, however, any insulative material may be used if it has a higher etch resistance than the insulative material the hard mask is deposited on. Approximately 500–1000 angstroms of hard mask material 430 is deposited on the first insulative material 420. FIG. 4(c) shows the creation of a photomask 440 with an opening for a via. Using an etching process, the first thin hard mask 430 is etched through to the underlying first insulative material 420 as shown in FIG. 4(d). The photomask 440 is removed as shown in FIG. 4(e). FIG. 4(f) shows the deposition of a second insulative material 450. The second insulative material 450 may or may not be the same material as the first insulative material 420. Approximately 7000 angstroms of insulative material 450 is deposited. FIG. 4(g) shows the deposition of a second hard mask 460. The second hard mask 460 may or may not be the same material as the first hard mask 430. Approximately 500–1000 angstroms of hard mask material 460 is deposited. FIG. 4(h) shows the creation of a second photomask 470 with an opening for a conductive line. Using an etching process, the hard mask 460 and the second insulative material 450 are etched to the first hard mask 430 and first insulative material 420, creating conductive line opening 455, as shown in FIG. 4(i). The second photomask 470 is removed as shown in FIG. 4(j). A thin layer of spacer material 480 is deposited on second hard mask 460 and in conductive line opening 455 as shown in FIG. 4(k). Approximately 500 angstroms of spacer material 480 is deposited forming horizontal and vertical layers of material. Typical materials used for the spacer material include silicon dioxide and silicon nitride. Using a directional etching process, the horizontal spacer material is removed as shown in FIG. 4(l), leaving vertical spacer material 480. Using any available etching process, the first insulative material 420 is etched through to the underlying substrate 410, creating via opening 425, as shown in FIG. 4(m). Remaining spacer material 480 may optionally be removed. A conductive material 490 is deposited in via opening 425 and conductive line opening 455 as shown in FIG. 4(n). Via opening X is typically 0.25 microns and conductive line opening Y is typically 0.35 microns.

Typically spacer layers have been used in doping technologies, such as in processes to create a lightly doped drain. In the present invention, the spacer layer is used to form a vertical etching barrier. Although the spacer layer and hard mask layers have a higher dielectric constant than the polymer material, the overall capacitance of the circuit is raised only slightly. Both the spacer layer and the hard mask layer have higher etch resistances than the polymer used as the insulative material.

Figure 5:
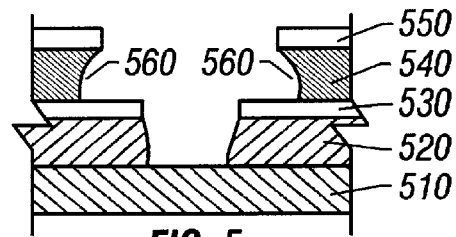
FIG. 5 shows typical problems resulting from non-use of a spacer layer in a dual damascene process utilizing a polymer material as the insulative material.

FIG. 5 is a demonstration of typical problems resulting from non-use of a spacer layer. First insulative material 520 is deposited on substrate 510. After similar processing as shown in FIGS. 4(a)–(m), but not including the deposition of the spacer layer, the side walls 560 of the conductive line opening are barrel shaped as shown in FIG. 5. The well-defined edges of vias and conductive line openings created by using the present invention allows smaller geometries to be used, reducing via widths below 0.25 micron.

This new method of dual damascene processing may be used with any soft materials or at any time well defined conductive line and via openings are desired.

Although the present invention has been fully described above with reference to specific embodiments, other alternative embodiments will be apparent to those of ordinary skill in the art. Therefore, the above description should not be taken as limiting the scope of the present invention that is defined by the appended claims.

What is claimed is:

1. A method of fabricating interconnecting vias and conductive lines in successive layers of insulative material, the method comprising:

forming a first thin layer of hard mask material above a first layer of insulative material;

forming a via opening in the first thin layer of hard mask material;

forming a second thin layer of hard mask material above a second layer of insulative material, said second layer of insulative material having been formed above said first thin layer of hard mask material and within the via opening in the first thin layer of hard mask material;

forming a conductive line opening in said second layer of insulative material, said conductive line opening in said second layer of insulative material having side walls;

forming a thin vertical layer of spacer material adjacent said side walls of said conductive line opening in said second layer of insulative material and adjacent at least a portion of the via opening in the first thin layer of hard mask material, the thin vertical layer of spacer material having a thickness of less than about half a difference in widths of the conductive line opening and the via opening in the first thin layer of hard mask material;

forming a via opening in said first layer of insulative material; and filling said conductive line opening and said via opening with conductive material.

2. The method of claim 1, wherein said first layer of insulative material and said second layer of insulative material is a polymer material with a low dielectric constant.

3. The method of claim 1, wherein said thin vertical layer of spacer material has a higher etch resistance than said second layer of insulative material.

4. The method of claim 1, wherein said first thin layer of hard mask material has a higher etch resistance than said first layer of insulative material and said second thin layer of hard mask material has a higher etch resistance than said second layer of insulative material.

5. The method of claim 1, wherein said thin vertical layer of spacer material is removed prior to filling said via opening and said conductive line opening with the conductive material.

6. A method of fabricating interconnecting vias and conductive lines in an insulative material, the method comprising:

depositing a first thin layer of hard mask material on a first layer of insulative material;

forming a via opening in said first thin layer of hard mask material;

depositing a second layer of insulative material on said first thin layer of hard mask material and within the via opening in the first thin layer of hard mask material;

depositing a second thin layer of hard mask material on said second layer of insulative material;

forming a conductive line opening in said second layer thin layer of hard mask material and in said second layer of insulative material, said conductive line opening having vertical side walls and a horizontal floor;

depositing a thin layer of spacer material on said second thin layer of hard mask material and on said vertical side walls and said horizontal floor of said conductive line opening, creating thin vertical spacer layers adjacent the vertical side walls and a thin horizontal spacer layer above the horizontal floor, the thin layer of spacer material having a thickness of less than about half a difference in widths of the conductive line opening and the via opening in the first thin layer of hard mask material;

removing said thin horizontal spacer layer above the horizontal floor, leaving at least some spacer material abjacent at least a portion of the via opening in the first thin layer of hard mask material;

forming a via opening in said first layer of insulative material; and filling said via opening in said first layer of insulative material and said conductive line opening in said second layer of insulative material with a conductive material.

7. The method of claim 6, wherein said first layer of insulative material and said second layer of insulative material is a polymer material with a low dielectric constant.

8. The method of claim 6, wherein said thin vertical spacer layers have a higher etch resistance than said second layer of insulative material.

9. The method of claim 6, wherein said first thin layer of hard mask material has a higher etch resistance than said first layer of insulative material and said second thin layer of hard mask material has a higher etch resistance than said second layer of insulative material.

10. The method of claim 6, wherein said thin layer of spacer material is removed prior to filling said via opening sand said conductive line opening with the conductive material.

11. A method comprising:

forming a first hard mask layer above a first insulative layer;

forming a via opening in the first hard mask layer;

forming a second hard mask layer above a second insulative layer, the second insulative layer having been formed above the first hard mask layer and within the via opening in the first hard mask layer;

forming a conductive line opening in the second insulative layer, the conductive line opening in the second insulative layer having side walls;

forming spacers adjacent the side walls of the conductive line opening in the second insulative layer and adjacent at least a portion of the via opening in the first hard mask layer, the spacers having a thickness of less than about half a difference in widths of the conductive line opening and the via opening in the first hard mask layer;

forming a via opening in the first insulative layer; and forming a conductive structure in the conductive line opening and in the via opening.

12. The method of claim 11, wherein the first and second insulative layers comprise a polymer material having a low dielectric constant.

13. The method of claim 11, wherein the spacers have a higher etch resistance than the second insulative layer.

14. The method of claim 11, wherein the first hard mask layer has a higher etch resistance than the first insulative layer and the second hard mask layer has a higher etch resistance than the second insulative layer.

15. The method of claim 11, wherein the spacers are removed before forming the conductive structure in the conductive line opening and in the via opening.

16. The method of claim 11, wherein forming the spacers adjacent the side walls of the conductive line opening in the second insulative layer and adjacent the at least the portion of the via opening in the first hard mask layer comprises forming a layer of spacer material above the second hard mask layer and adjacent the side walls and above a horizontal floor of the conductive line opening, and removing the layer of spacer material above the horizontal floor of the conductive line opening, leaving a portion of the layer of spacer material adjacent the at least the portion of the via opening in the first hard mask layer.

17. The method of claim 16, wherein the first and second insulative layers comprise a polymer material having a low dielectric constant.

18. The method of claim 16, wherein the spacers have a higher etch resistance than the second insulative layer.

19. The method of claim 16, wherein the first hard mask layer has a higher etch resistance than the first insulative layer and the second hard mask layer had a higher etch resistance than the second insulative layer.

20. The method of claim 16, wherein the spacers are removed before forming the conductive structure in the conductive line opening and in the via opening.

* * * * *